United States Patent [19]
Taito et al.

[11] Patent Number: 5,852,583
[45] Date of Patent: *Dec. 22, 1998

[54] SEMICONDUCTOR MEMORY DEVICE THAT CAN REALIZE HIGH SPEED DATA READ OUT

[75] Inventors: Yasuhiko Taito; Shinji Kawai; Shinichi Kobayashi, all of Hyogo; Akinori Matsuo; Masashi Wada, both of Tokyo, all of Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 848,391

[22] Filed: May 8, 1997

[30] Foreign Application Priority Data

May 10, 1996 [JP] Japan ..................... 8-116427

[51] Int. Cl.⁶ .................................................. G11C 8/00
[52] U.S. Cl. ............................. 365/230.06; 365/230.03; 365/230.08
[58] Field of Search ................. 365/230.06, 230.03, 365/230.08

[56] References Cited

U.S. PATENT DOCUMENTS

| | | | |
|---|---|---|---|
| 4,916,334 | 4/1990 | Minagawa et al. | 307/296.3 |
| 4,922,458 | 5/1990 | Watanabe et al. | 365/189.05 |
| 4,951,259 | 8/1990 | Sato et al. | 365/230.06 |
| 5,398,047 | 3/1995 | Nara et al. | 345/190 |
| 5,490,119 | 2/1996 | Sakurai et al. | 365/230.08 |
| 5,612,924 | 3/1997 | Miyamoto | 365/233.5 |
| 5,615,164 | 3/1997 | Kirihata et al. | 365/230.06 |
| 5,621,691 | 4/1997 | Park | 365/200 |

FOREIGN PATENT DOCUMENTS 6-111591  4/1994  Japan.

Primary Examiner—David C. Nelms
Assistant Examiner—Hien Nguyen
Attorney, Agent, or Firm—McDermott, Will & Emery

[57] ABSTRACT

Following latching of a word line select signal by a latch circuit, a transfer gate is turned off. When a word line is selected, the voltage applied to the latch circuit is shifted to a desired level to apply a desired voltage to the word line from a word line driver. As a result, a predecode signal is applied to a small size buffering circuit to be transmitted to the word line driver at a potential level between Vcc-GND. Therefore, the parasitic capacitance accompanying a predecode signal is reduced.

6 Claims, 11 Drawing Sheets

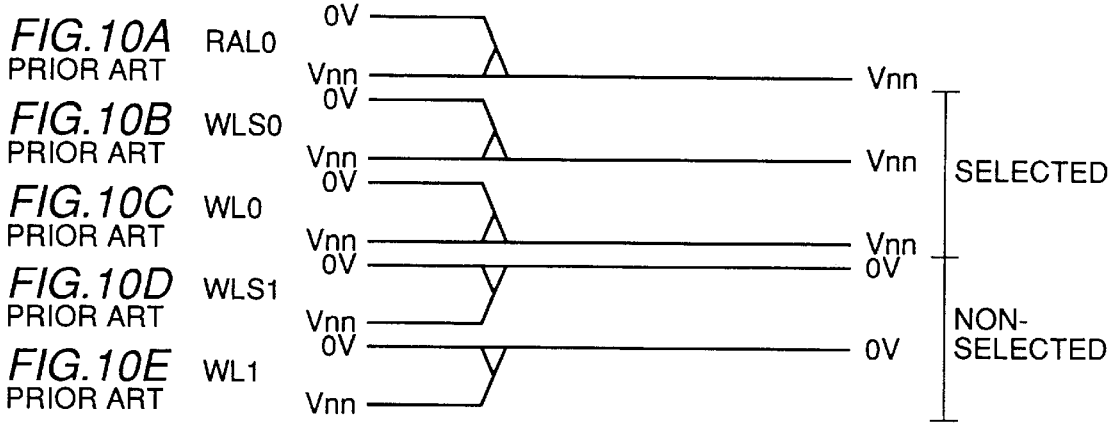
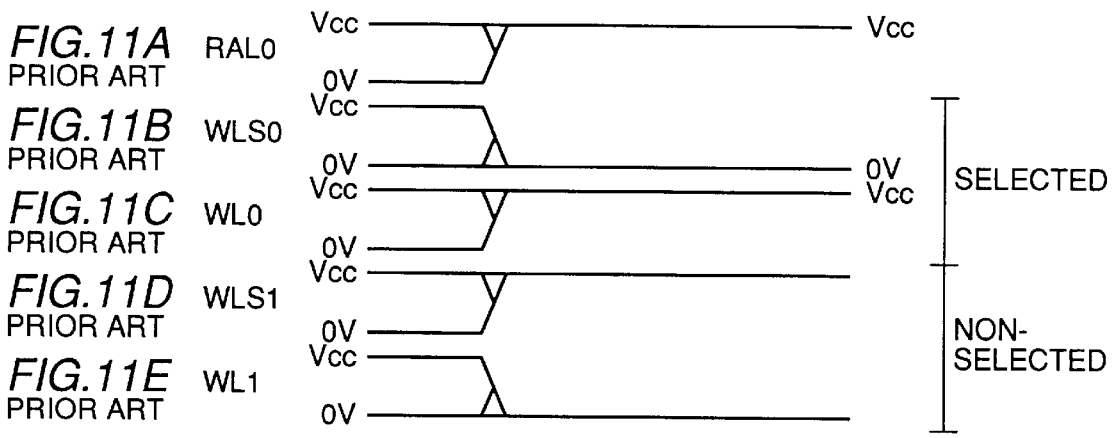
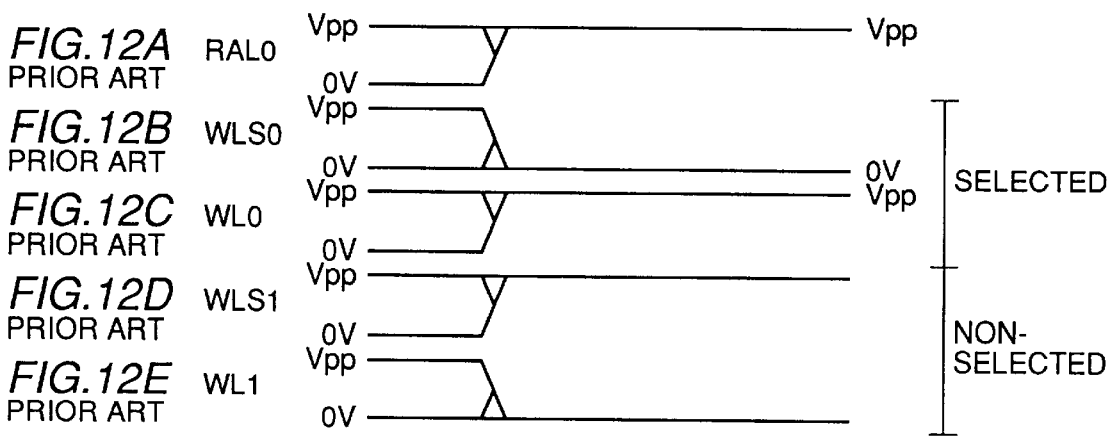

SEMICONDUCTOR MEMORY DEVICE THAT CAN REALIZE HIGH SPEED DATA READ OUT

BACKGROUND OF THE INVENTION

1. Field of the Invention

The present invention relates to semiconductor memory devices.

2. Description of the Background Art

FIG. 9 shows a structure of a conventional semiconductor memory device including a word line and a circuit for driving a word line.

A word line driver DS, for example, is selected by a predecode signal RAL0 applied to a power source V thereof, and a word line driver select signal WLS0 applied to the gate thereof.

The voltage apply conditions to a memory cell in each operation mode of erasure, programming and reading in a DINOR type flash memory are shown in FIGS. 13–15. As shown in FIG. 13, the voltage applied to a word line is approximately 10V (Vpp) in data erasure. As shown in FIG. 14, the applied voltage is approximately −8V (Vnn) in data programming. As shown in FIG. 15, the applied voltage is approximately 3V (Vcc) in data reading. Level shift circuits 3, 7 and 13 are provided for switching the level of a predecode signal RAL0 or a word line driver select signal WLS0 or WLS1 according to the aforementioned operation modes as shown in FIG. 9 to apply the voltages to word line WL0 that is to be selected. The level of each signal is switched according to the operation mode.

The operation of data programming, data reading, and data erasure of the conventional semiconductor memory device is shown in the timing charts of FIGS. 10A–10E, 11A–11E, and 12A–12E, respectively.

A great parasitic capacitance is established for predecode signal RAL0 applied to power source V of word line drivers DS and DN.

In order to achieve high speed data readout, the great load of word lines WL0 and WL1 must be driven at high speed. Therefore, word line drivers DS and DN must have a great driving capability. Word line drivers DS and DN are formed of MOS transistors TP3, TN3, TP7, and TN7 having a great gate width. This means that the area and circumferential length of the source and drain of the transistor is increased to result in a great junction capacitance. Since a great number of word line drivers DS and DN are connected, there is a possibility of a great parasitic capacitance such as several tens pF for predecode signal RAL0.

The predecoder must be formed using a transistor of high breakdown voltage in association with handling high voltage. Since the driving capability of a transistor of high breakdown voltage is generally low, a great driver must be used if a great parasitic capacitance is to be driven at high speed. There is also a case where high speed cannot be achieved even if the driver is increased when the parasitic resistance of the interconnection is too great.

SUMMARY OF THE INVENTION

An object of the present invention is to provide a semiconductor memory device that can realize high speed data readout.

According to an aspect of the present invention, a semiconductor memory device includes a plurality of word lines, a plurality of word line driver circuits driving a word line, each provided corresponding to a word line, and a predecode signal generation circuit responsive to an input first address for generating and supplying a predecode signal to the word line driver circuit. The word line driver circuit includes a buffer for receiving and buffering a predecode signal, a select signal output circuit responsive to an input second address for providing the predecode signal output from the buffer as a select signal, a latch circuit connected to the select signal output circuit for latching a select signal, a word line driver connected to the select signal output circuit, and responsive to a select signal for activating a word line, a first voltage supply circuit for supplying a voltage to the word line driver, and a disconnection circuit for disconnecting the latch circuit and the word line driver from the select signal output circuit.

The present invention is advantageous in that state transition of a word line is effected at high speed to allow data to be read out speedily.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 10A–10E are timing charts of the semiconductor memory device of FIG. 9 in data programming.

FIGS. 11A–11E are timing charts showing an operation of the semiconductor memory device of FIG. 9 in data reading.

FIGS. 12A–12E are timing charts showing an operation of the semiconductor memory device of FIG. 9 in data erasure.

DESCRIPTION OF THE PREFERRED EMBODIMENTS

Figure 1:
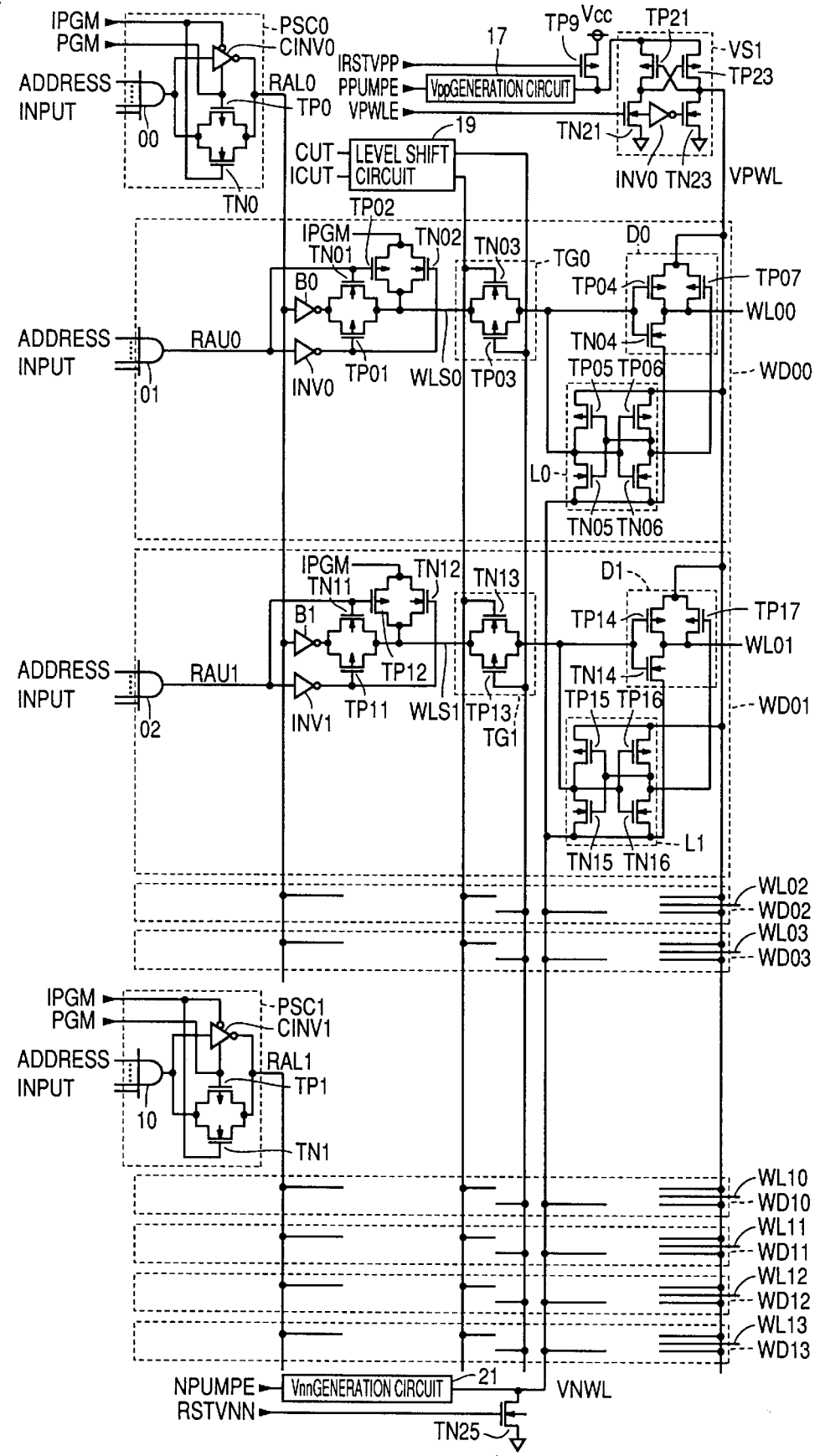
FIG. 1 is a circuit diagram showing a structure of a semiconductor memory device according to a first embodiment of the present invention.

Embodiments of the present invention will be described hereinafter with reference to the drawings. Like reference characters in the drawings indicate identical or corresponding components.

First Embodiment

Referring to FIG. 1, a semiconductor memory device according to a first embodiment of the present invention includes word lines WL00–WL03, and WL10–WL13, word line drive units WD00–WD03, and WD10–WD13, and predecode signal generation units PSC0 and PSC1.

Each word line drive unit has a similar structure. For example, word line drive unit WD00 includes an AND circuit 01 receiving an address to generate a predecode signal RAU0, an inverter B0 receiving a predecode signal RAL0 output from a predecode signal generation unit PSC0 and buffering the same, a select signal output unit responsive to predecode signal RAU0 output from AND circuit 01 for providing a predecode signal output from inverter B0 or signal IPGM as select signal WLS0, a latch circuit L0 for latching select signal WLS0, a word line driver D0 responsive to select signal WLS0 to activate word line WL00, and a transfer gate TG0 for disconnecting latch circuit L0 and word line driver D0 from the select signal output unit.

The select signal output unit includes an inverter INV0, N channel MOS transistors TN01, TN02, and P channel MOS transistors TP01, TP02.

Transfer gate TG0 includes a P channel MOS transistor TP03 and an N channel MOS transistor TN03. The gate of N channel MOS transistor TN03 and the gate of P channel MOS transistor TP03 are both connected to a level shift circuit 19.

A voltage VPWL is supplied from a voltage supply circuit VS1 to word line driver D0 and latch circuit L0. Furthermore, N channel MOS transistors TN05 and TN06 in latch circuit L0 have their source nodes connected to the drain node of N channel MOS transistor TN25 and to Vnn generation circuit 21.

The operation of the semiconductor memory device of the first embodiment will be described hereinafter. Description is provided of the case where word line WL00 is selected and word line WL01 is non-selected.

Figure 2:
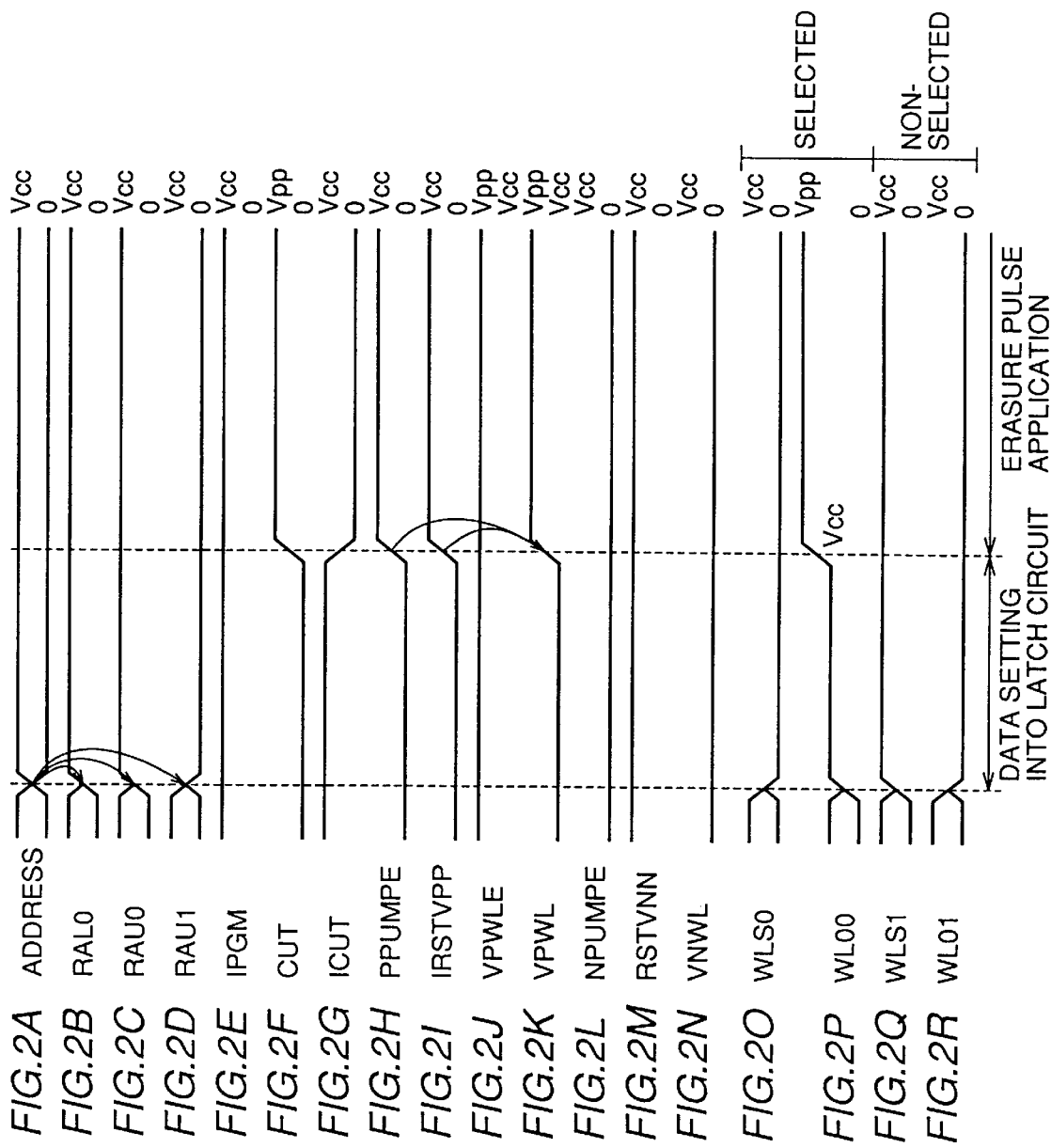
FIGS. 2A–2R are timing charts showing an operation of the semiconductor memory device of FIG. 1 in data erasure.

FIGS. 2A–2R are timing charts showing the operation of erasing data programmed in a memory cell.

Figure 13:
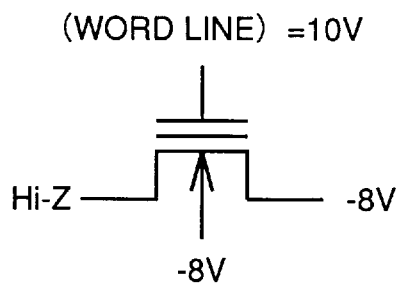
FIG. 13 shows a voltage apply condition for erasing data in a memory cell in a DINOR type flash memory.

In a data erasure operation, a voltage of level Vpp (approximately 10V) must be applied to selected word line WL00, as shown in FIG. 13. Referring to FIG. 2A and FIG. 2B, predecode signal RAL0 is selected by an address input, whereby a voltage of level Vcc (referred to as "H" level hereinafter) is applied to inverter B0. Referring to FIG. 2C, predecode signal RAU0 is driven to an H level. Referring to FIG. 2O, select signal WLS0 attains the level of 0 (referred to as "L" level hereinafter). Since signals CUT and ICUT attain an L level and H level, respectively, as shown in FIG. 2F and FIG. 2G, select signal WLS0 of an L level is applied to latch circuit L0 via transfer gate TG0. P channel MOS transistor TP04 is turned on since select signal WLS0 of an L level is applied to the gate thereof. Therefore, voltage VPWL is supplied to word line WL00. Since signal IRSTVPP attains an L level as shown in FIG. 2(i), P channel MOS transistor TP9 is turned on. Voltage VPWL attains a Vcc level as shown in FIG. 2K.

Voltage VNWL of an L level is applied to non-selected word line WL01 as shown in FIG. 2N and FIG. 2R. This is because, as shown in FIGS. 2D, 2E, and 2R, predecode signal RAU1 attains an L level, and P channel MOS transistor TP12 and N channel MOS transistor TN12 are turned on to provide signal IPGM of an H level as select signal WLS1 from the select signal output unit, whereby select signal WLS1 of an H level is applied to latch circuit L1 via transfer gate TG1.

After data setting towards latch circuits L0 and L1 is completed, transfer gates TG0 and TG1 are both turned off with signals CUT and ICUT at the level of Vpp and L, respectively, as shown in FIG. 2F and FIG. 2G. As a result, latch circuits L0, L1 and word line drivers D0, D1 are disconnected from the select signal output unit. Then, as shown in FIG. 2H, signal PPUMPE is activated, whereby voltage VPWL of level Vpp shown in FIG. 2K is supplied from Vpp generation circuit 17. Thus, a voltage of level Vpp is applied to selected word line WL00.

Figure 3:
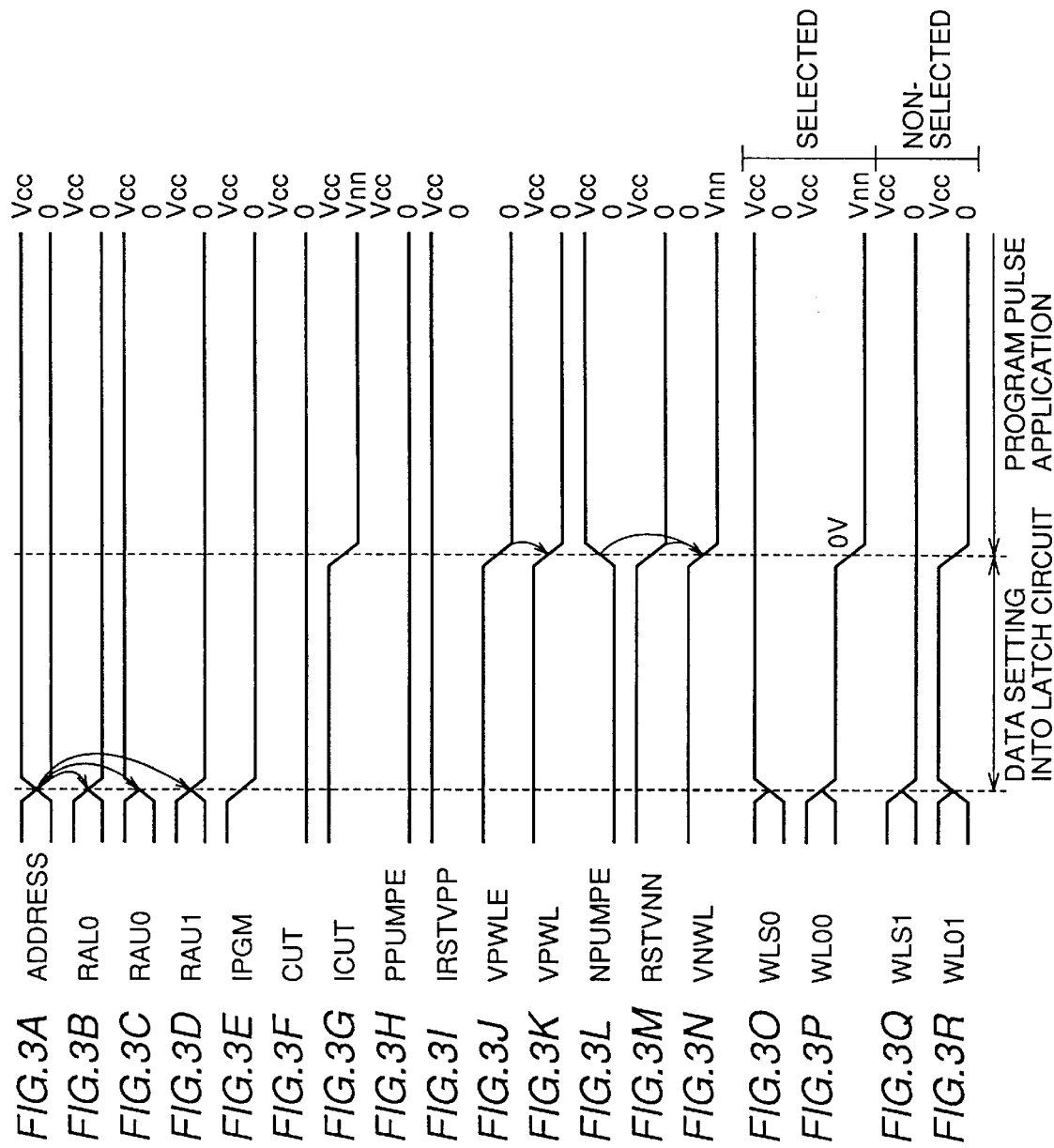
FIGS. 3A–3R are timing charts showing an operation of the semiconductor memory device of FIG. 1 in data programming.

FIGS. 3A–3R are timing charts showing the operation of programming data into a memory cell.

Figure 14:
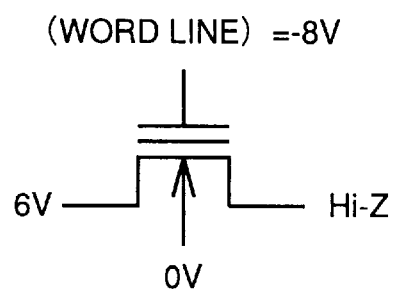
FIG. 14 shows a voltage apply condition for programming data in a memory cell in a DINOR type flash memory.

In a program operation, a voltage of level Vnn (approximately –8V) must be applied to selected word line WL00 as shown in FIG. 14. In this case, signal IPGM is driven to an L level as shown in FIG. 3E. In response, predecode signal RAL0 is selected by the address input towards AND circuit 00 to attain an L level as shown in FIG. 3A and FIG. 3B. Therefore, select signal WLS0 of an H level is applied to latch circuit L0 via transfer gate TG0. As a result, voltage VNWL of level 0 shown in FIG. 3N is applied to word line WL00 from word line driver D0.

Conversely, N channel MOS transistor TN11 and P channel MOS transistor TP11 are turned off, and P channel MOS transistor TP12 and N channel MOS transistor TN12 are turned on, whereby signal IPGM of an L level is applied to latch circuit L1. Thus, as shown in FIG. 3R, voltage VPWL of level Vcc shown in FIG. 3K is supplied to word line WL01.

After data setting towards latch circuits L0 and L1 is completed, transfer gates TG0 and TG1 are turned off with signals CUT and ICUT at the levels of 0 and Vnn, respectively, as shown in FIG. 3F and FIG. 3G, respectively. As a result, latch circuits L0 and L1 and word line drivers D0 and D1 are disconnected from the select signal output unit. Then, by lowering the levels of voltages VPWL and VNWL to 0 and Vnn, respectively, as shown in FIG. 3K and FIG. 3N, a voltage of level Vnn is applied to selected word line WL00 as shown in FIG. 3P.

Figure 4:
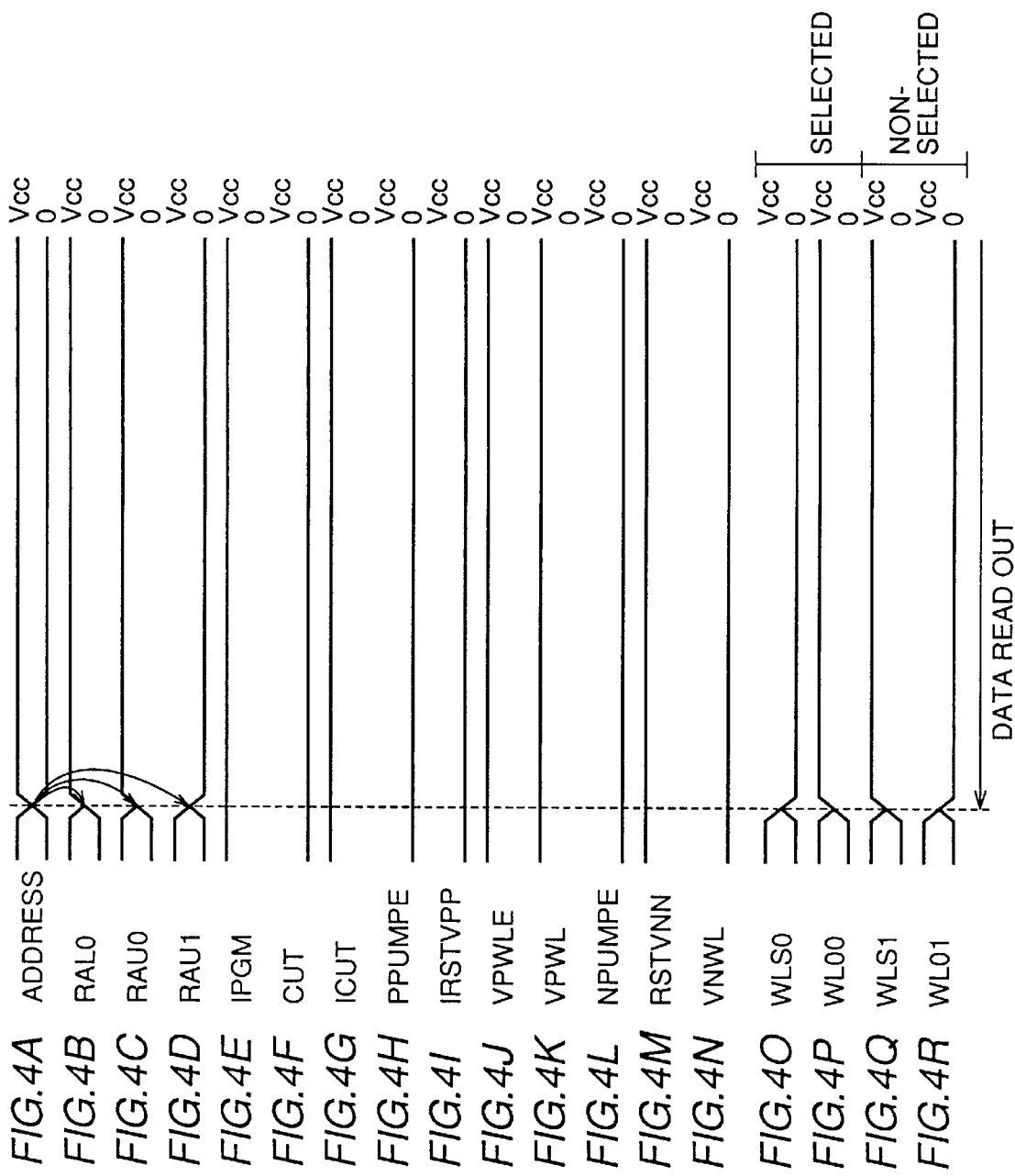
FIGS. 4A–4R are timing charts showing an operation of the semiconductor memory device of FIG. 1 in data read out.

FIGS. 4A–4R are timing charts showing an operation of reading out data from a memory cell.

Figure 15:
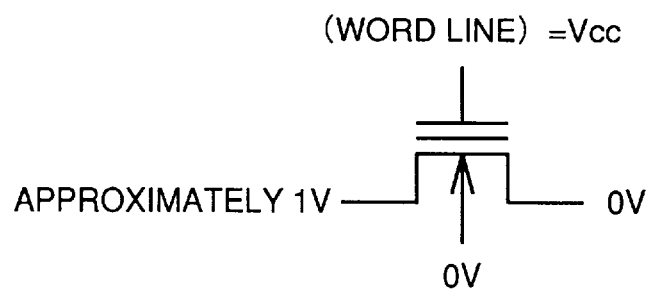
FIG. 15 shows a voltage apply condition for reading out data from a memory cell in a DINOR type flash memory.

In readout operation, a voltage of level Vcc must be applied to the selected word line as shown in FIG. 15. In this case, the level of voltages VPWL and VNWL are driven to Vcc and 0, respectively, as shown in FIG. 4K and FIG. 4N. Also, as shown in FIGS. 4E, 4F and 4G, signal IPGM is driven to an H level, and signals CUT and ICUT are driven to an L level and an H level, respectively, whereby transfer gates TG0 and TG1 are turned on. As a result, as shown in FIG. 4P and FIG. 4R, a voltage of level Vcc is applied to selected word line WL00, and a voltage of level 0 is applied to non-selected word line WL01.

Thus, the semiconductor memory device of the first embodiment includes word line drivers D0 and D1 that applies a voltage of a plurality of different levels to word lines WL00 and WL01. Therefore, predecode signal RAL0 can be transmitted to word line drivers D0 and D1 at a level between Vcc and GND. Word line drive units WD00–WD03 and WD10–WD13 will drive word lines WL00 and WL01 after predecoder signals RAL0 and RAL1 are received and buffered with a gate of a small size (such as inverters B0 and B1). Therefore, the parasitic capacitance accompanying predecode signal RAL0 according to connection of a word line driver is comparatively small to the great parasitic capacitance of a conventional case. According to the first embodiment of the present invention, only the gate capacitance of a small gate is established. Therefore, the parasitic capacitance applied to predecode signals RAL0 and RAL1 can be reduced significantly. It is no longer required to use a transistor of a high breakdown voltage to drive predecode signals RAL0 and RAL1. Data can be read out speedily.

Second Embodiment

Figure 5:
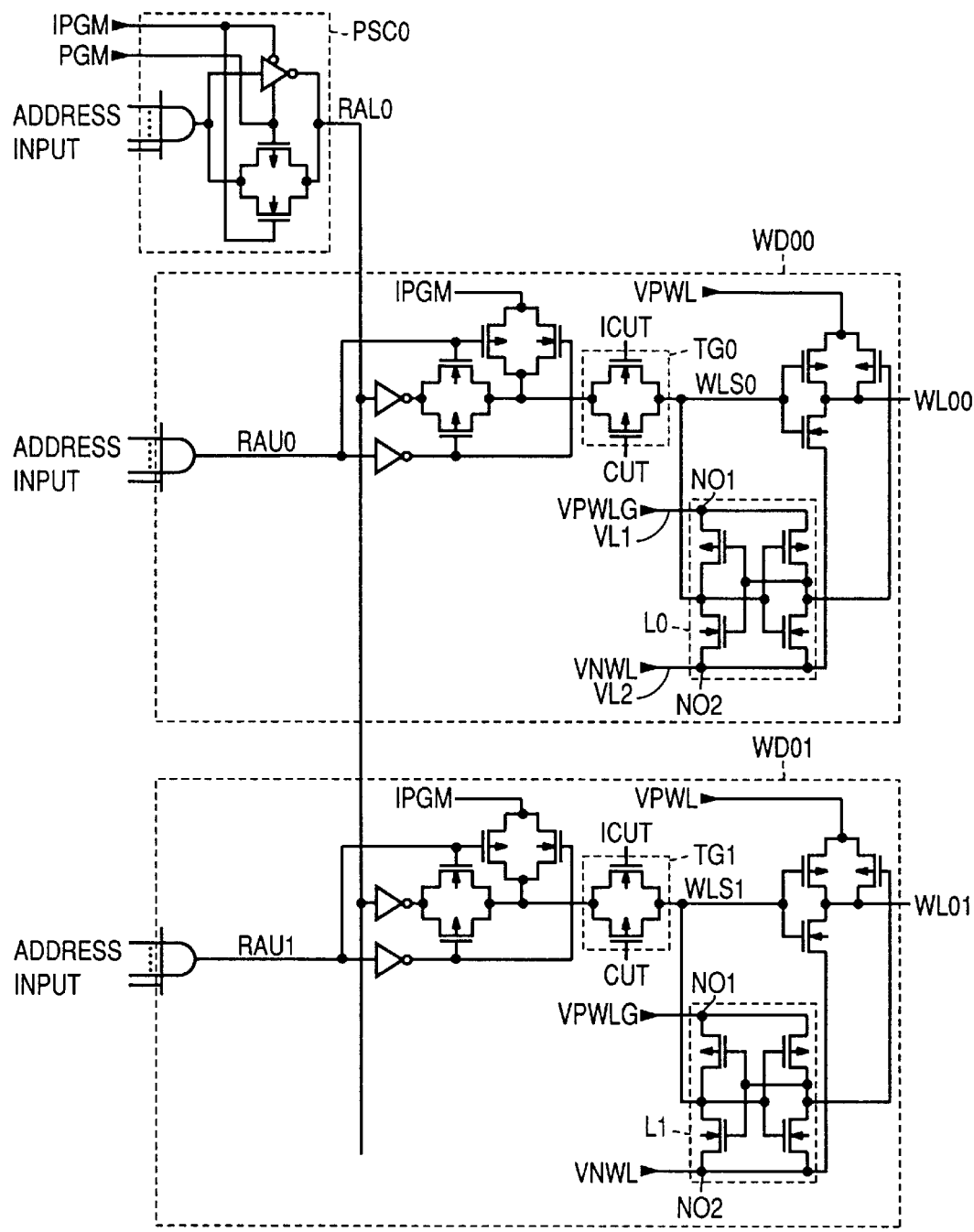
FIG. 5 is a circuit diagram showing a structure of a semiconductor memory device according to a second embodiment of the present invention.

FIG. 5 is a circuit diagram showing a structure of a semiconductor memory device according to a second embodiment of the present invention.

The semiconductor memory device of the second embodiment has a structure similar to that of the semiconductor memory device of the first embodiment, provided that voltage VPWLG is applied to a node NO1 of latch circuits L0 and L1.

The semiconductor memory device of the first embodiment includes latch circuits L0 and L1 for latching select signals WLS0 and WLS1 in word line drive units WD00 and WD01, respectively. After data is temporarily set at latch circuit L0, voltages VPWL and VNWL supplied to latch circuit L0 are altered in level to shift the level of the voltage supplied to word line WL00.

In this case, there is a possibility that the data held in latch circuits L0 and L1 identical in number to word lines WL00 and WL01 must be inverted in switching among the modes of erasure, programming, and reading operation. When the driving capability of the driver (not shown) for applying inverted data to latch circuits L0 and L1 is insufficient, the data will not be inverted, so that unintentioned data is held in latch circuits L0 and L1. This will become the cause of erroneous operation.

In order to avoid this problem, the second embodiment has voltage VPWLG applied to latch circuits L0 and L1 independent of voltage VPWL supplied to word line driver D0 and D1.

The operation of the semiconductor memory device according to the second embodiment will be described specifically hereinafter.

It is to be noted that word line WL00 is selected and the remaining word lines such as WL01 are non-selected in the following description.

In reading out data, data is retained by signal IPGM of an H level in latch circuit L1 in word line drive unit WD01 corresponding to non-selected word line WL01. Therefore, almost all the latch circuits hold data by signal IPGM of an H level in a read out operation.

In a program mode, data is latched by applying signal IPGM of an L level to latch circuit L1 in word line drive unit WD01 corresponding to non-selected word line WL01. Therefore, almost all the latch circuits maintain the data by signal IPGM of an L level.

In the state transition from a readout mode to a program mode, inversion occurs in almost all the latch circuits. There is a possibility that the latch data is not inverted if the capability of the driver (not shown) of signal IPGM that supplies inverted data to latch circuit L1 and the like is not sufficient. There is a possibility that proper data is not set.

To avoid this possibility, voltages VPWLG and VNWL are set at ground potential in setting data towards latch circuit L1 and the like. When select signals WLS0 and WLS1 are ascertained, voltage VPWLG is slowly raised to the level of Vcc to complete the data setting operation. Since the current required for the inversion operation of latch circuit L1 and the like is supplied by voltage supply lines VL1 and VL2 of a great feeding capability, desired data can be reliably set in latch circuit L1 even when a great number of latch data are inverted at the same time.

Third Embodiment

In the semiconductor memory device of the above embodiment, the data set in latch circuits L0 and L1 will punch through to word lines WL00 and WL01 if voltage VPWL attains level Vcc during the data setting period of latch circuits L0 and L1. There is a possibility that the voltage of level Vcc is supplied to word lines WL00 and WL01 depending upon data set in latch circuits L0 and L1. For example, in a data programming operation, all word line drivers D1 and the like corresponding to non-selected word line WL01 and the like respond to the input signal IPGM of an L level to supply voltage VPWL to word line WL01 and the like. If voltage VPWL attains the Vcc level, voltage of level Vcc will be applied to almost all word lines WL01 and the like.

This will disturb the data maintained in the memory cell. This problem must be circumvented to secure reliability.

Figure 6:
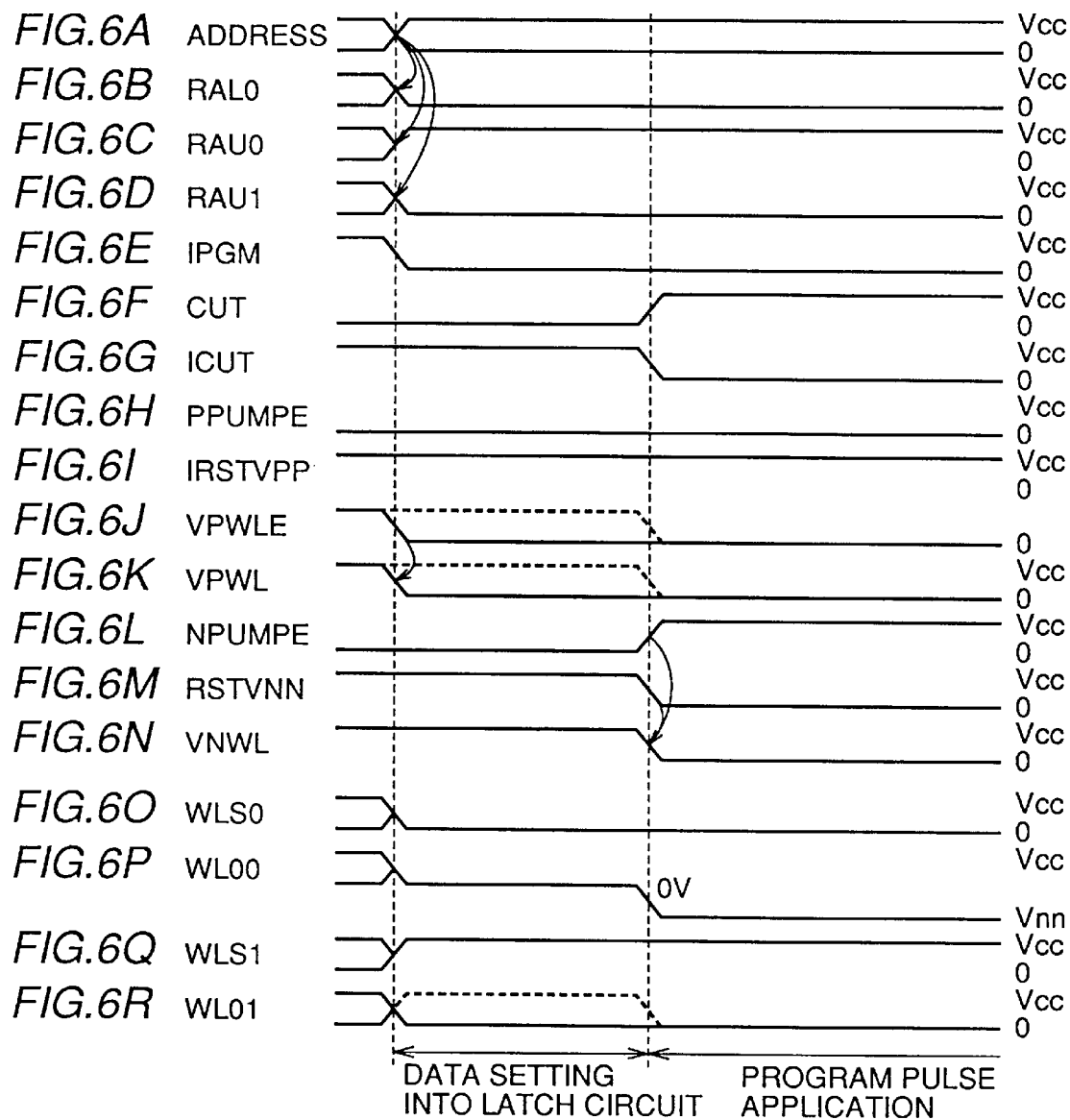
FIGS. 6A–6R are timing charts showing an operation of the semiconductor memory device of a third embodiment in data programming.

The semiconductor memory device according to the third embodiment of the present invention solves such a problem. The present semiconductor memory device has a structure similar to that of the first and second embodiments. The operation shown in the timing charts of FIGS. 6A–6R is carried out in data programming.

More specifically, as shown in FIG. 1, voltage VPWLE is applied to the gate of N channel MOS transistor TN21 in voltage supply circuit VS1. Since the level thereof is set to an L level as shown in FIG. 6J and FIG. 6K, voltage VPWL attains the level of 0V during data setting of latch circuits L0 and L1. Therefore, the voltage supplied to word line WL01 and the like attains the level of ground voltage independent of the latch data.

According to the semiconductor memory device of the third embodiment, the punch through of latch data to word line WL01 and the like in data setting of latch circuits L0 and L1 is suppressed. The problem of unintended voltage being applied to word line WL01 and the like during data setting towards latch circuits L0 and L1 can be eliminated.

Fourth Embodiment

In the semiconductor memory device of the above-described first to third embodiments, the data held in latch circuits L0 and L1 contends with newly input data when select signals WLS0 and WLS1 are switched. In this case of contention, determination of a select signal is delayed particularly in reading out data from a memory cell. As a result, the data access time is delayed.

Figure 7:
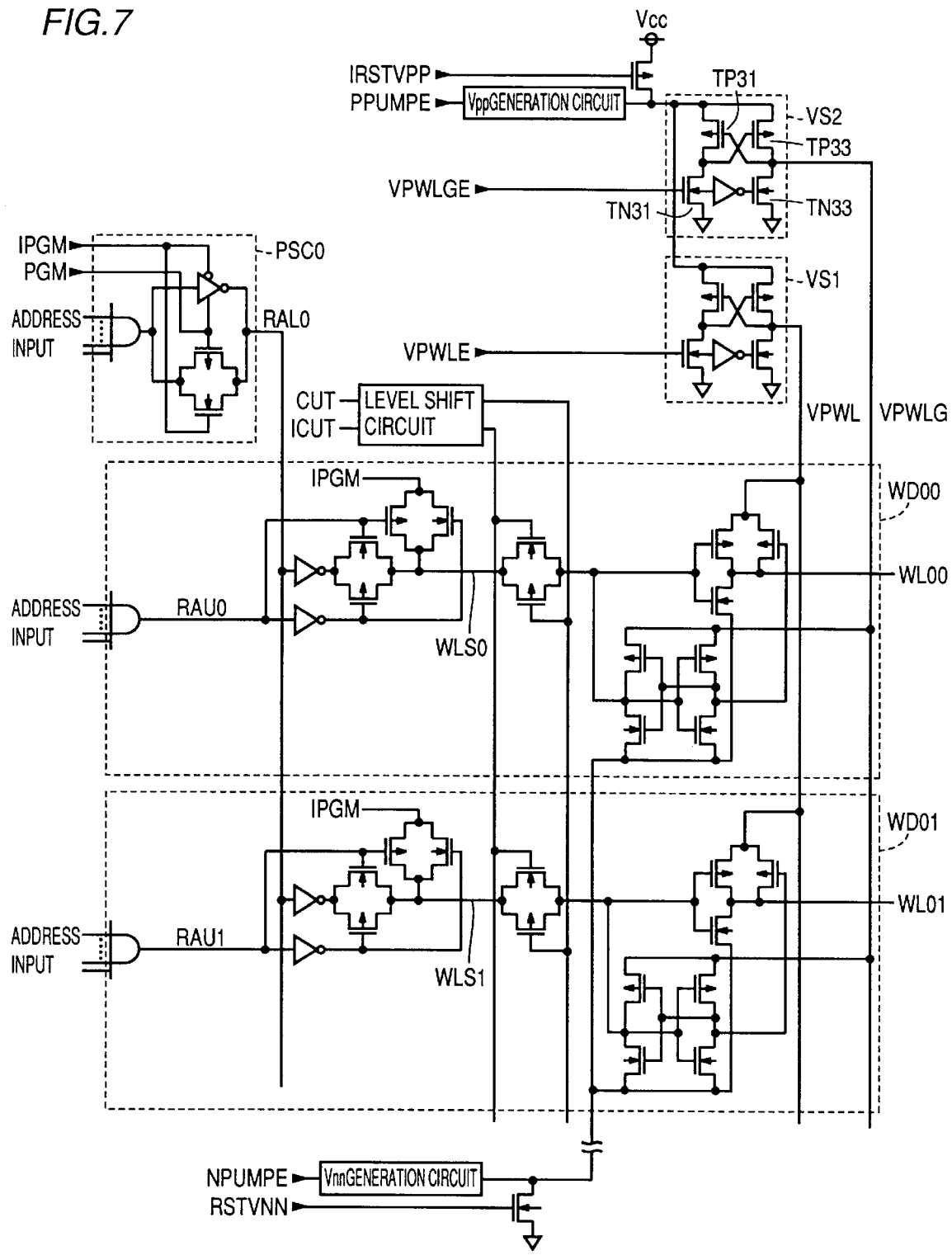
FIG. 7 is a circuit diagram showing a structure of a semiconductor memory device according to a fourth embodiment of the present invention.

To solve such a problem, the semiconductor memory device of the fourth embodiment is provided having a structure as shown in FIG. 7. The semiconductor memory device of the fourth embodiment shown in FIG. 7 has a structure similar to that of the first embodiment, provided that a voltage supply circuit VS2 is further included, and voltage VPWLG is applied to latch circuits L0 and L1.

Figure 8:
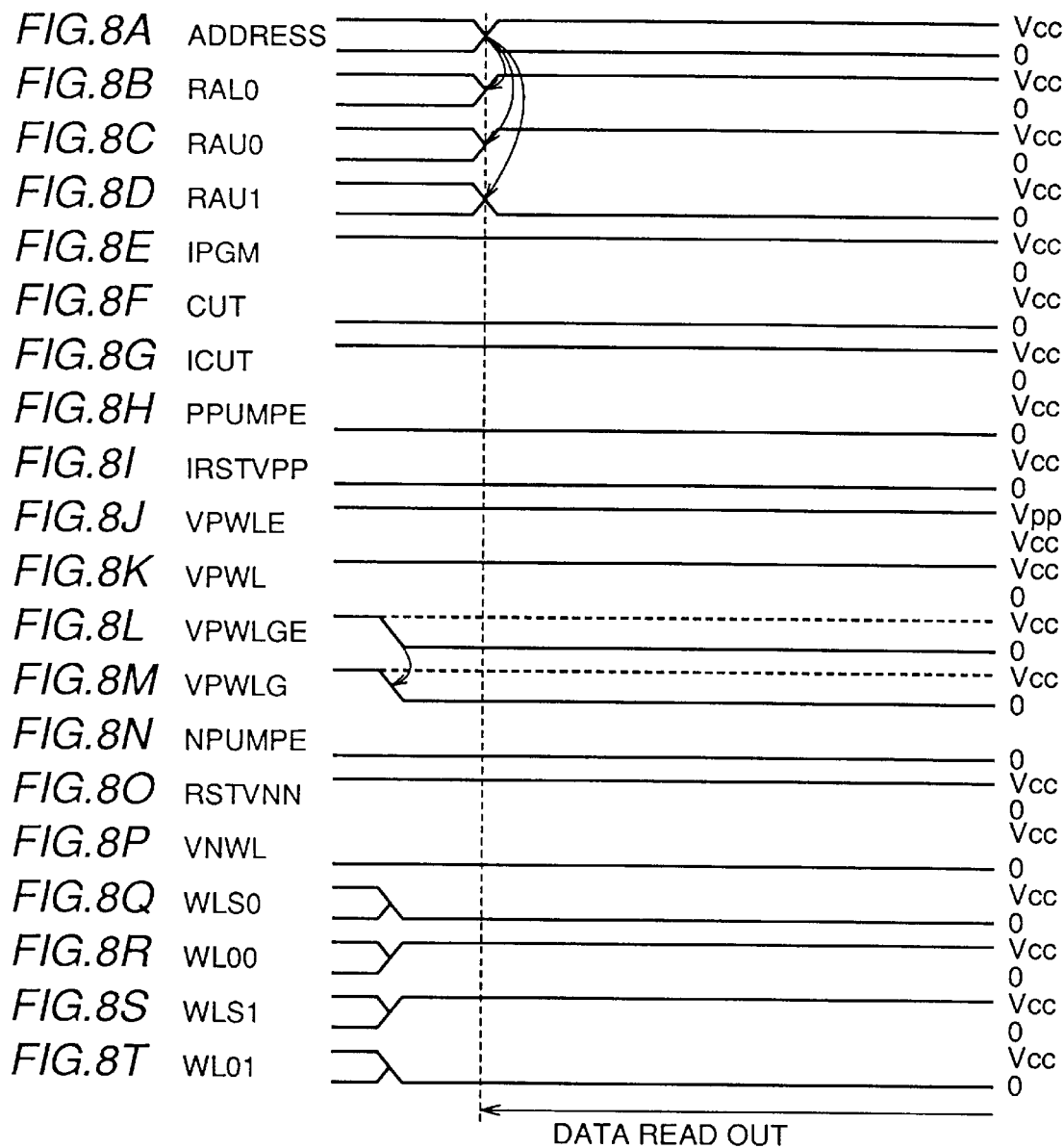
FIGS. 8A–8T are timing charts showing an operation of the semiconductor memory device of FIG. 7 in data readout.
Figure 9:
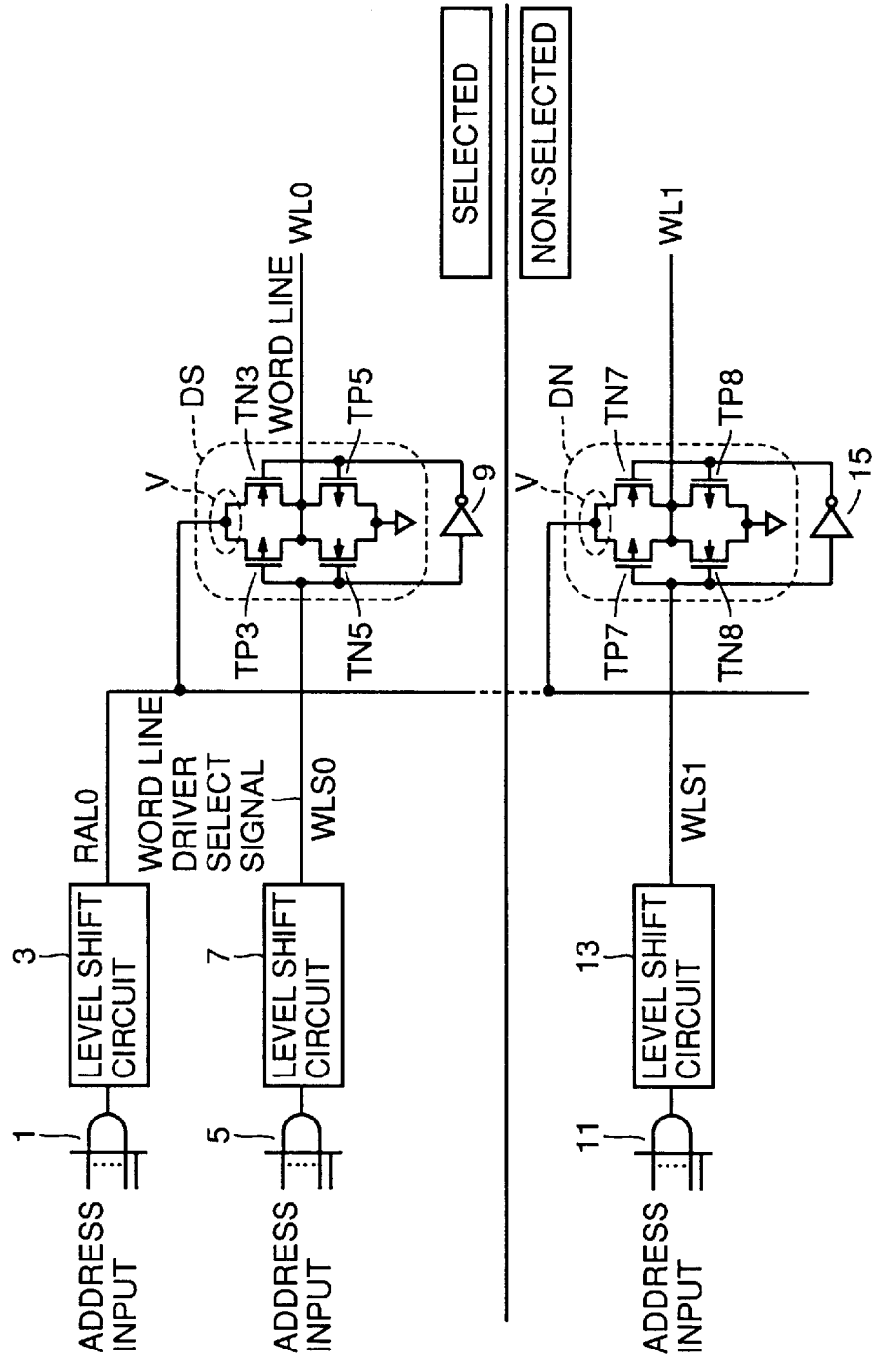
FIG. 9 shows a structure of a conventional semiconductor memory device.

FIGS. 8A–8T are timing charts showing the operation of reading out data of the semiconductor memory device of the fourth embodiment. As shown in FIG. 8L and FIG. 8M, voltage VPWLG of 0V is applied to latch circuits L0 and L1 by driving voltage VPWLGE to an L level applied to the gate of N channel MOS transistor TN31 of voltage supply circuit VS2.

According to the semiconductor memory device of the fourth embodiment, contention is suppressed between the data latched in latch circuits L0 and L1 and newly input data occurring at the time of switching select signals WLS0 and WLS1 in a data readout operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of word lines, a plurality of word line drive means for selectively driving said word lines, each provided corresponding to each of said word lines, and predecode signal generation means responsive to a first address for generating a predecode signal and supplying said predecode signal to said word line drive means, wherein each of said word line drive means comprises buffer means for receiving and buffering said predecode signal, select signal output means responsive to a second address for providing said predecode signal from said buffer means as a select signal, latch means connected to said select signal output means for latching said select signal, a word line driver connected to said select signal output means, and responsive to said select signal for selectively activating said word lines, first voltage supply means for supplying a first voltage to said word line driver, and disconnection means for disconnecting said latch means and said word line driver from said select signal output means.

2. The semiconductor memory device according to claim 1, further comprising second voltage supply means for applying a second voltage to said latch means.

3. The semiconductor memory device according to claim 1, wherein said first voltage supply means supplies a ground voltage during setting of said select signal into said latch means.

4. The semiconductor memory device according to claim 2, wherein said first voltage supply means supplies a ground voltage during setting of said select signal into said latch means.

5. The semiconductor memory device according to claim 2, wherein said second voltage supply means supplies a ground voltage during drive of said word lines by said word line drive means to read out data.

6. The semiconductor memory device according to claim 4, wherein said second voltage supply means applies a ground voltage during drive of said word lines by said word line drive means to read out data.

* * * * *